(12) United States Patent
Stein et al.

(10) Patent No.: US 6,772,079 B2
(45) Date of Patent: Aug. 3, 2004

(54) METHOD AND APPARATUS FOR EQUALIZATION OF A SIGNAL ACQUISITION SYSTEM

(75) Inventors: Anatoli Stein, Atherton, CA (US); Nahum Guzik, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 298 days.

(21) Appl. No.: 10/082,963

(22) Filed: Feb. 26, 2002

(65) Prior Publication Data

US 2003/0109999 A1 Jun. 12, 2003

Related U.S. Application Data

(60) Provisional application No. 60/340,979, filed on Dec. 7, 2001.

(51) Int. Cl.⁷ .......................... G01D 18/00; G01R 35/00
(52) U.S. Cl. .......................................... 702/86; 324/601
(58) Field of Search .............................. 702/86; 324/601

(56) References Cited

U.S. PATENT DOCUMENTS

| | | | |
|---|---|---|---|
| 5,214,670 A | * 5/1993 | Ballatore | 375/231 |
| 5,406,429 A | * 4/1995 | Noguchi et al. | 360/65 |
| 5,418,817 A | * 5/1995 | Richter | 375/232 |
| 5,675,394 A | * 10/1997 | Choi | 348/614 |
| 5,698,984 A | * 12/1997 | Little et al. | 324/601 |

* cited by examiner

*Primary Examiner*—Marc S. Hoff
*Assistant Examiner*—Toan M. Le
(74) *Attorney, Agent, or Firm*—McDermott, Will & Emery

(57) ABSTRACT

In a signal acquisition system in accordance with the principles of the present invention, a digital signal acquisition system includes a front end, an equalizer and an output system. The front end typically includes an input amplifier and may include one or more preamplifiers, and any one of various input probes. The probes may be directed toward different applications, that is, voltage probes or current probes, for example, and may include preamplifiers that adjust the range of input signals. The output of the probe is typically routed to an input amplifier, which may include various filters and/other signal conditioning circuitry. The system also includes an analog to digital converter that is arranged to receive a conditioned analog input signal from the input amplifier. The analog to digital converter converts the conditioned analog input signal to digitized input signal. The equalizer accepts the digitized input signal and filters the signal to produce a signal that has been compensated for inadequacies in the signal acquisition system's front end. Coefficients for the equalizer are determined and stored within the system during a calibration process. The calibration process employs a model signal acquisition system and the target signal acquisition system to determine a transfer function difference between the systems and uses this difference to compute the equalization coefficients.

30 Claims, 11 Drawing Sheets

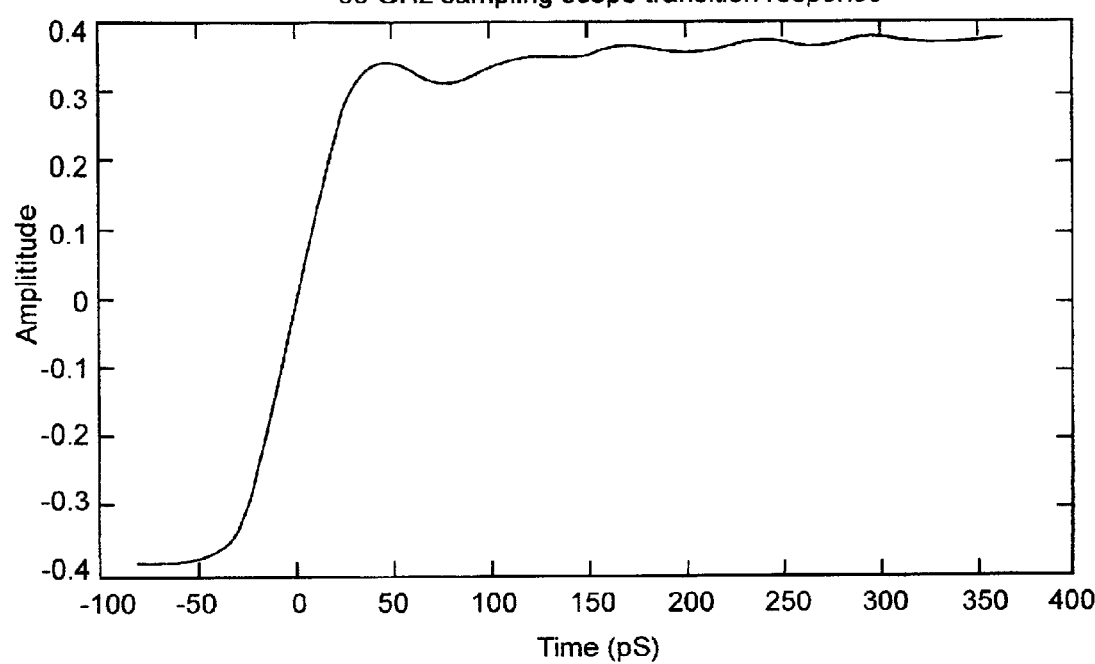
FIG. 5A  50 GHz sampling scope transition response
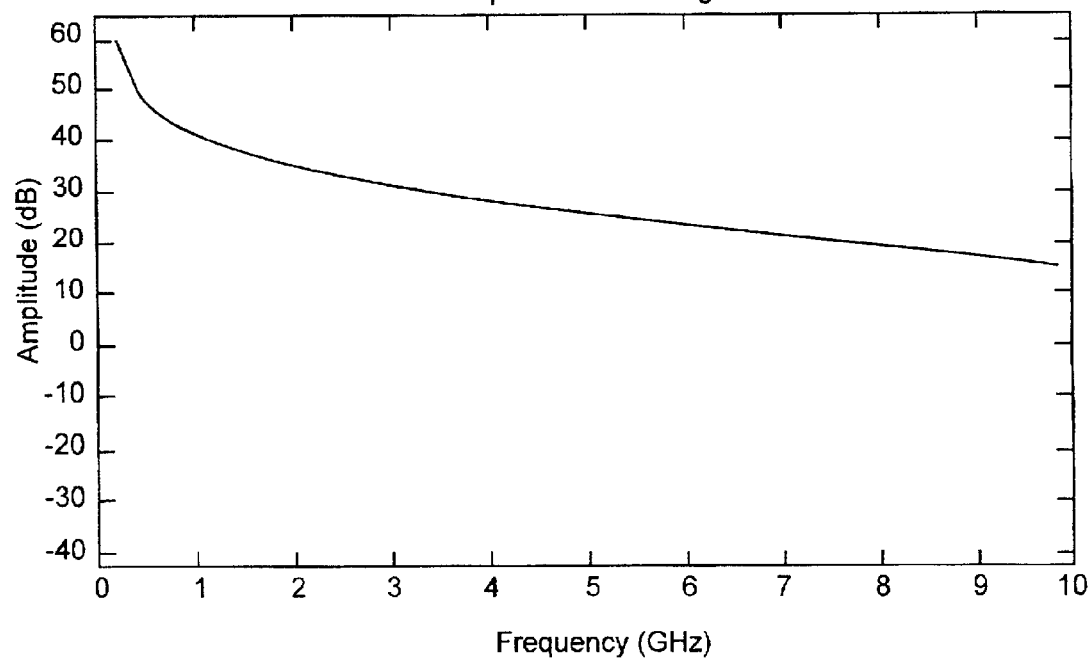
FIG. 5B  Spectrum of the signal

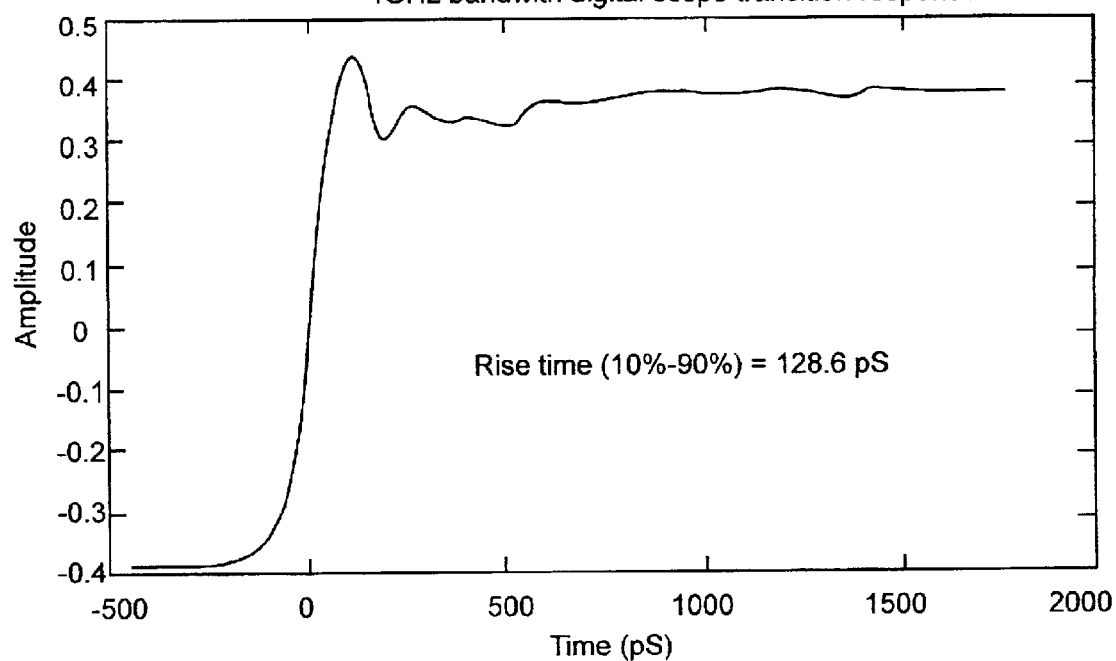
FIG. 7A  4GHz bandwith digital scope transition response
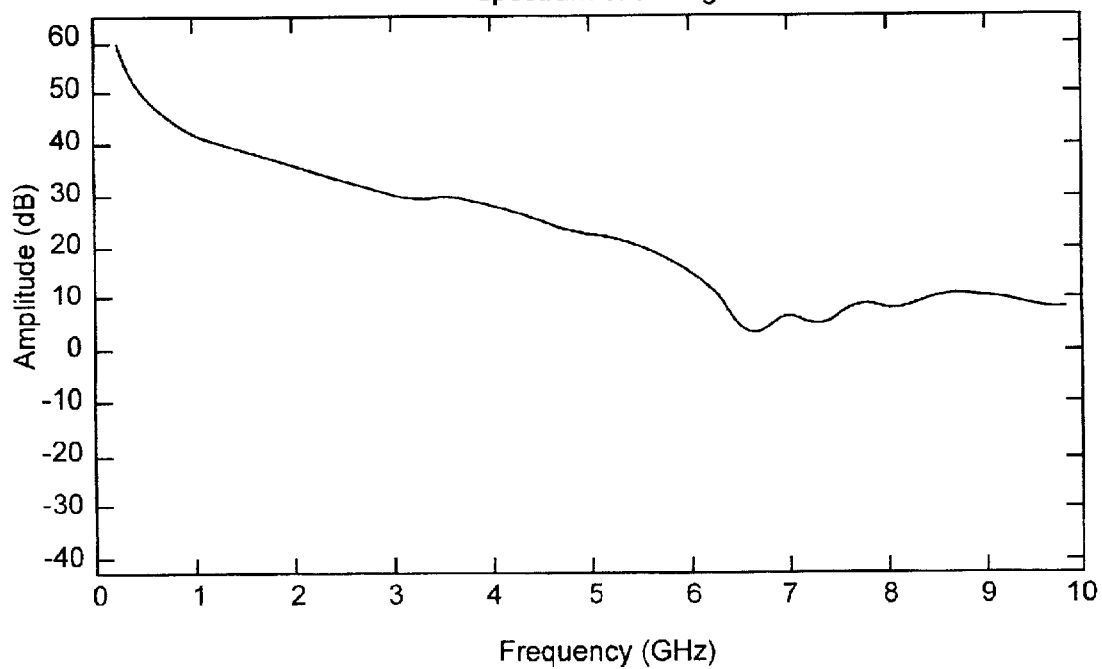
FIG. 7B  Spectrum of the signal

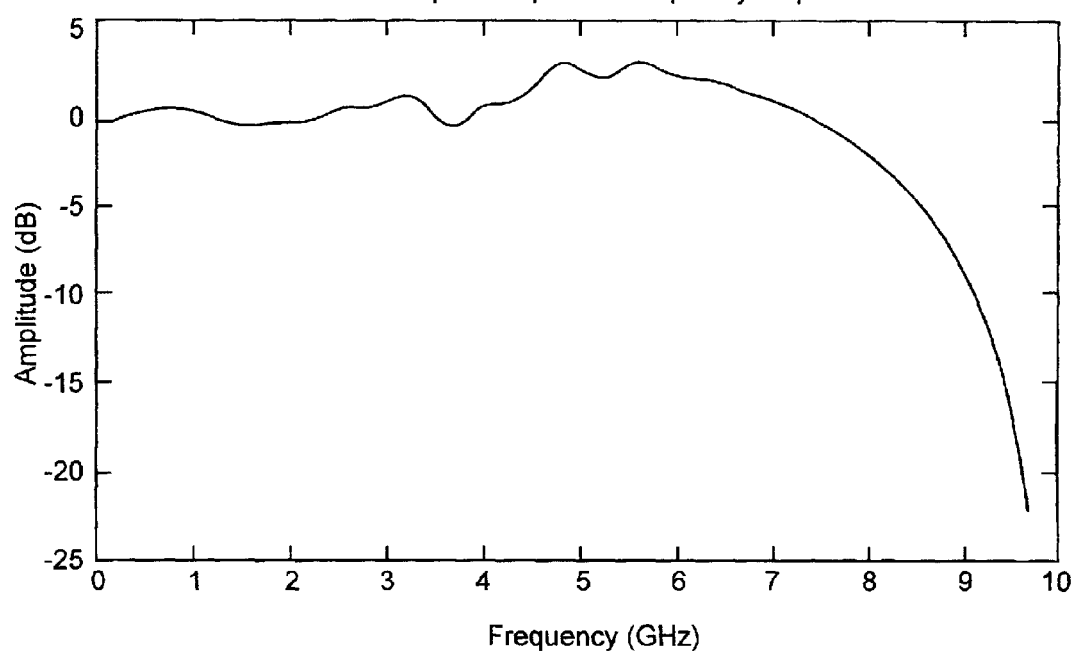
FIG. 8A 60-tap FIR equalizer frequency response
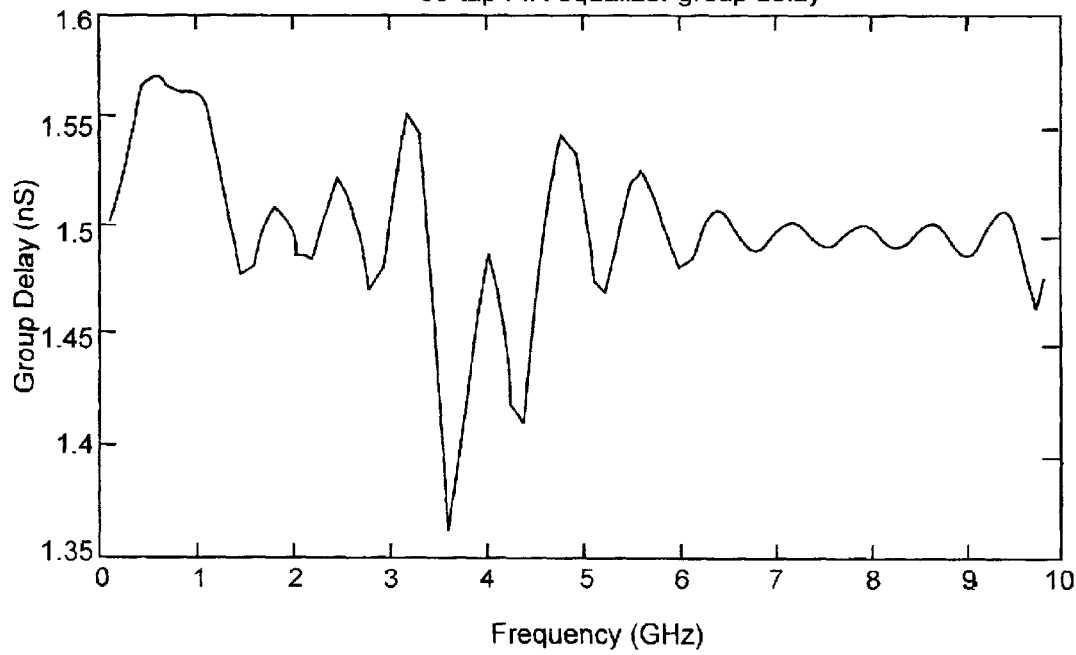
FIG. 8B 60-tap FIR equalizer group delay FIG. 11A  Equalized digital scope frequency response
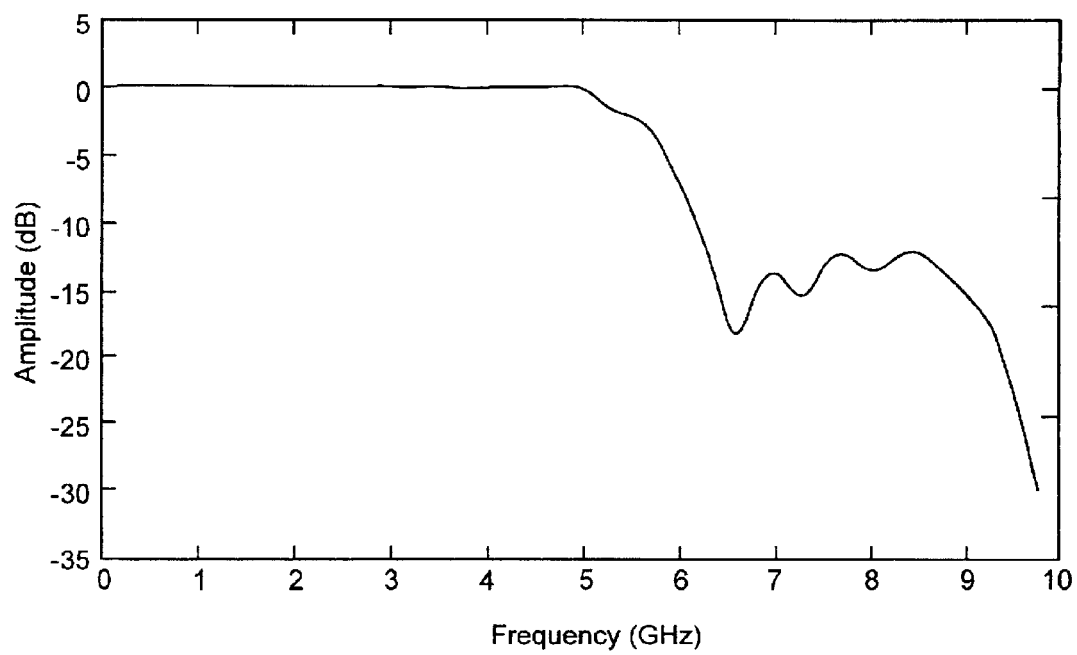
FIG. 11B
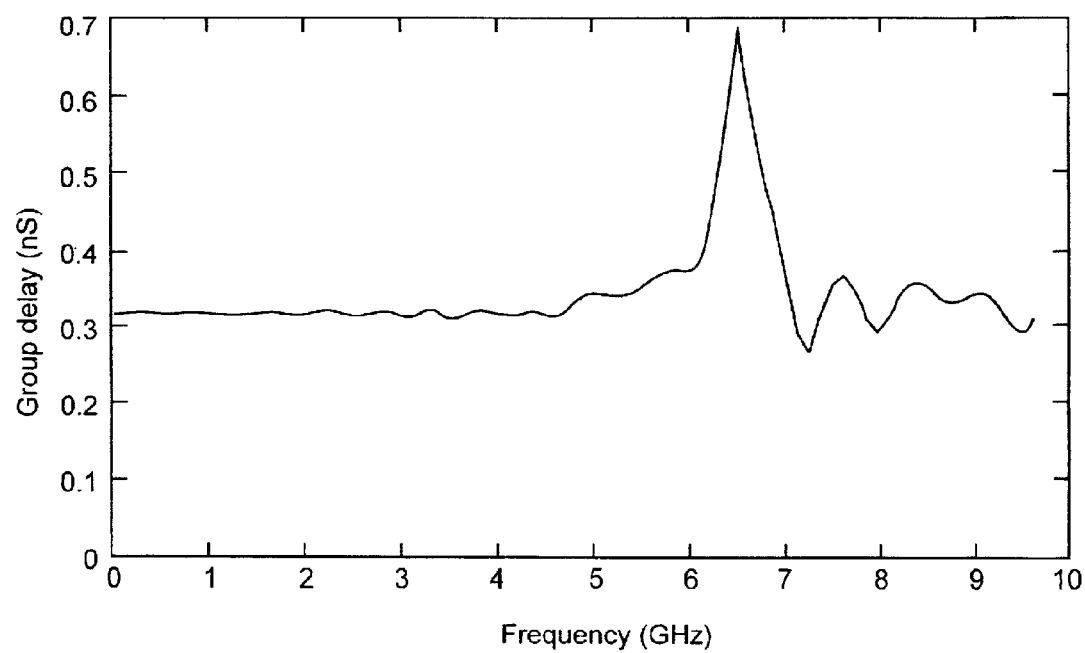

METHOD AND APPARATUS FOR EQUALIZATION OF A SIGNAL ACQUISITION SYSTEM

CROSS-REFERENCE TO RELATED APPLICATIONS

This application claims the benefit of U.S. Provisional Application No. 60/340,979 entitled "METHOD AND APPARATUS FOR TRANSFER FUNCTION EQUALIZATION OF DIGITAL OSCILLOSCOPE OR OTHER DATA ACUISITION SYSTEMS" filed on Dec. 7, 2001, the disclosure of which is hereby incorporated by reference in its entirety.

FIELD OF THE INVENTION

The invention relates to signal acquisition systems and, more particularly, to the compensation of errors that arise in signal acquisition systems.

BACKGROUND OF THE INVENTION

Signal acquisition systems provide for the sampling of continuous time electrical signals that may be representative of any of a very wide variety of objects and processes. The familiar PQRST of an electrocardiogram, the echo image of fetus, the blip of a radar screen, a signal waveform traced on the CRT of an oscilloscope; all are electrical signals representative of very different functions. Frequently such analog electrical signals are digitized, not only for the convenience of analysis on digital computers, but also for digital signal conditioning that enhances the display of such information. Ideally, a signal acquisition system provides a distortion-free means for sampling a signal of interest. However, as Werner Heisenberg so famously suggested, the mere act of observing disturbs the observed event. Naturally, the degree of disturbance may vary widely, depending upon the quality of the sampling process and apparatus. But, distortion-free sampling of signals is typically the ideal toward which signal acquisition systems aspire.

Digitization not only provides for convenient analysis and display of acquired signals, because digitized values are much less susceptible to corruption and various forms of degradation than analog signals, post-digitization distortion and error contributions are minimal. That is to say, a large component of signal distortion in digital signal acquisition systems is attributable to the system's analog front end; that is, to that portion of the system that lies in the signal path between the signal acquisition system's input and the system's analog to digital converter (ADC).

A system and method for the compensation of distortion attributable to the front end of a signal acquisition system would therefore be highly desirable.

SUMMARY

In accordance with the principles of the present invention, a digital signal acquisition system includes a front end, an equalizer and an output system. The front end typically includes an input amplifier and may include one or more preamplifiers, and any one of various input probes. The probes may be directed toward different applications. That is, the probes may be voltage probes or current probes, for example, and may include preamplifiers that adjust the range of input signals. The output of the probe is typically routed to an input amplifier, which may include various filters and/other signal conditioning circuitry. The system also includes an analog to digital converter that is arranged to receive a conditioned analog input signal from the input amplifier. The analog to digital converter converts the conditioned analog input signal to digitized input signal. The equalizer accepts the digitized input signal and filters the signal to produce a signal that has been compensated for inadequacies in the signal acquisition system's front end. Coefficients for the equalizer are determined and stored within the system during a calibration process. The calibration process may include the development of coefficients for a variety of signal acquisition system settings. For example, in a digital oscilloscope embodiment, the equalizer may accommodate the use of various types of probe by storing different sets of equalization coefficients corresponding to the different types of probe.

The calibration process involves sending a test signal, such as a step or impulse signal, to a model signal acquisition system and to the signal acquisition system being calibrated. The test signal is a signal of sufficiently high frequency to encompass the range of frequencies over which the signal acquisition system is intended to operate. The output of the model signal acquisition system is Fourier-transformed, as is the unequalized output of the target, that is, uncalibrated, signal acquisition system. The difference between the Fourier transforms of the model and target systems is then computed, thus yielding the amplitude frequency response and group delay for the target signal acquisition system relative to the output of the ideal system. Given the amplitude-frequency response and group delay, conventional methods may be employed to compute the coefficients of a digital filter, an equalizer, that is used to filter the digitized input signal during normal operations. These coefficients are stored and employed by the signal acquisition system during normal signal acquisition operation. The equalized signal may be stored, displayed and/or transmitted to other systems for analysis or data reduction, for example. As previously noted, the calibration process may be repeated for various types of probes and the corresponding sets of equalization coefficients stored for use with the probes in the field.

Additionally, the acquisition system may include a facility for storing the transfer function (in the form of the amplitude/frequency response and group delay) of the model acquisition system. In such an embodiment, the signal acquisition system could also include analytical tools, such as a programmable digital signal processor and accompanying software, that could be used to update the coefficients in the field. The calibration process could employ a calibration signal that would permit the comparison of the acquisition system's transfer function to the model system's stored transfer function, and the development of updated equalization coefficients thereby. The calibration signal used in the field should be closely matched to the calibration signal used to determine the initial coefficients stored within the signal acquisition system.

In an illustrative embodiment, a signal acquisition system that employs an equalizer in accordance with the principles of the present invention takes the form of a digital oscilloscope. The oscilloscope employs various probes for acquiring signals of interest, amplifies and converts those signals to digital form and displays, stores, and/or transmits for analysis or display, the data representative of the input signal. The oscilloscope equalizes the digitized signal before displaying, storing, transmitting or otherwise "outputting" the signal. Equalizer coefficients are determined during a calibration process and stored. The oscilloscope then employs those coefficients in operation in the field to enhance the operation of the oscilloscope. During the calibration process, a relatively high bandwidth continuous time signal is fed to both the oscilloscope and a model signal acquisition system.

In the case of a digital oscilloscope, the model system includes an oscilloscope of much higher bandwidth than the "target" oscilloscope (that is, the oscilloscope being calibrated) and a filter having a predetermined frequency response which mimics the desired response of target oscilloscope. For example, for a 4 Ghz bandwidth target oscilloscope, the model signal acquisition system may include a relatively high bandwidth digital oscilloscope, such as a 50 Ghz oscilloscope, that is configured to receive the calibration signal. A 4 Ghz digital filter having the frequency response desired of the target oscilloscope accepts the digital output of the 50 Ghz signal and filters it to produce a model oscilloscope output. The output from the calibration signal generator (e.g., 50 GHz scope and ideal 4 GHz filter in this example) and the output from the target oscilloscope are each Fourier transformed. The difference between the Fourier transforms is computed and, given this amplitude frequency response and group delay, the coefficients to be used in the target oscilloscope's equalizer are computed and stored within the oscilloscope. Such equalization coefficients may be computed and stored for a variety of input conditions.

BRIEF DESCRIPTION OF THE DRAWINGS

The above and further features, aspects, and advantages of the invention will be apparent to those skilled in the art from the following detailed description, taken together with the accompanying drawings in which:

FIGS. 5A and 5B are graphical representations of the transition response and signal spectrum of a 50 GHz sampling scope employed in the calibration of a digital 4 GHz oscilloscope in accordance with the principles of the present invention;

FIGS. 7A and 7B are graphical representations the transition response and signal spectrum of a digital 4 GHz oscilloscope in accordance with the principles of the present invention, without equalization;

FIGS. 8A and 8B are graphical representations of the frequency response and group delay of an equalzer the coefficients of which were developed for a digital 4 GHz oscilloscope in accordance with the principles of the present invention;

FIGS. 11A and 11B are graphical representations of the equalized frequency response and group delay of the 4 GHz digital oscilloscope in accordance with the principles of the present invention.

DETAILED DESCRIPTION

Figure 1:
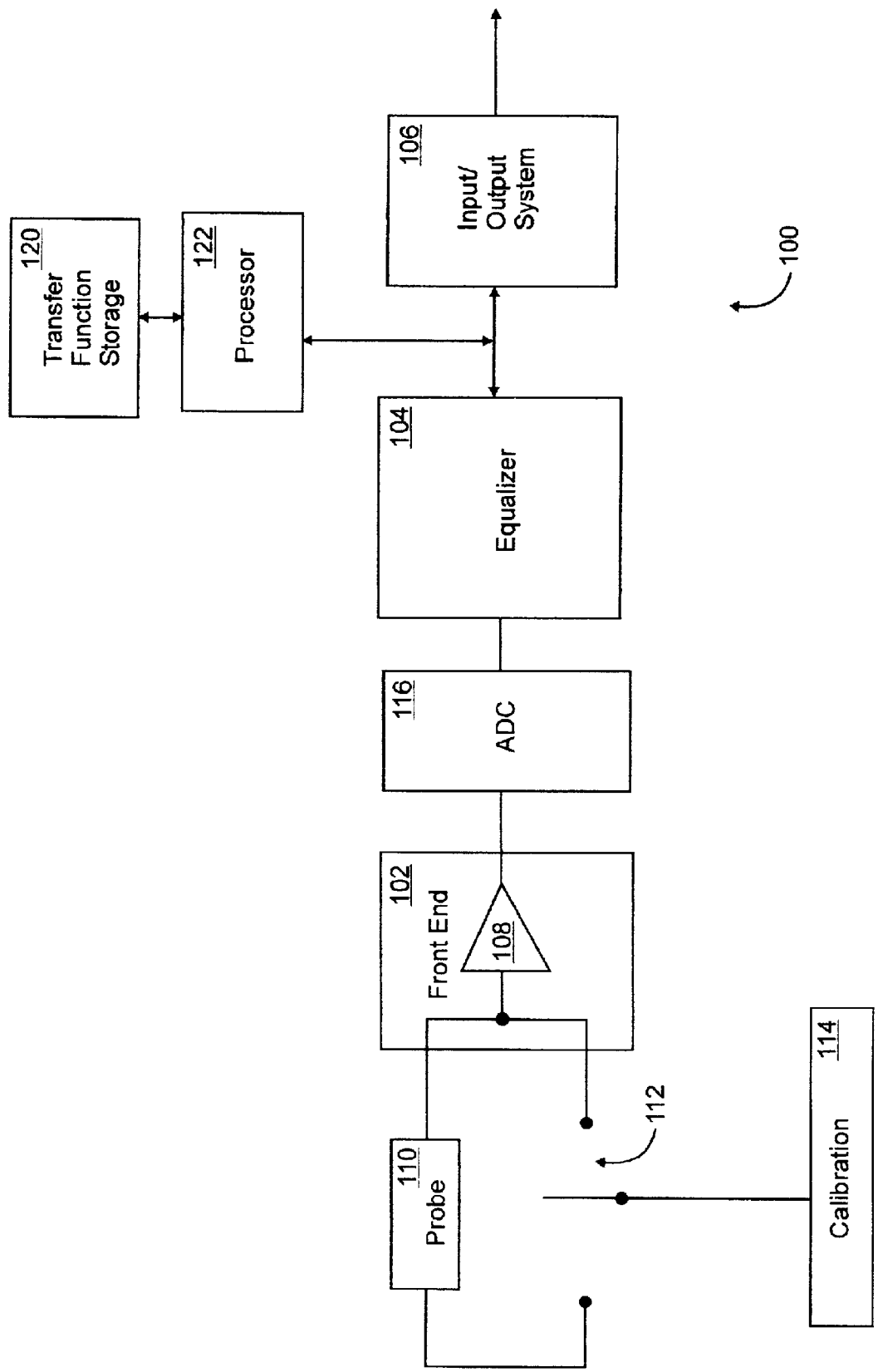
FIG. 1 is a conceptual block diagram of a signal acquisition system in accordance with the principles of the present invention.

The conceptual block diagram of FIG. 1 depicts a signal acquisition system 100 in accordance with the principles of the present invention that includes a front end 102, an equalizer 104 and an output system 106. The front end typically includes an input amplifier 108 and may include one or more preamplifiers (not shown). Any of various input probes 110 may be attached to the front end in order to couple signals from an article of interest to the signal acquisition system 100. Different probes may be directed toward different applications and/or different signal ranges. For example, probes may sense current, voltage or another physical characteristic, and the probes may include a preamplifier that adjusts the range of input signals. The front end 102 includes a switchable input 112 that may accept signals from a probe 110 or directly from a calibrating signal generator 114, for example. The acquired signal is typically routed from the switchable input 112 to an input amplifier 108 that may include various filters and/other signal conditioning circuitry. From the front end 102 an acquired signal is routed to an analog to digital converter (ADC) 116 that is arranged to receive a conditioned analog (e.g., continuous time) input signal from the input amplifier. The ADC 116 converts the conditioned analog input signal to a digitized input signal. The digitized input signal is routed to an equalizer 104, which may take the form of a multi-tap finite impulse response (FIR) filter, for example. The equalizer 104 accepts the digitized input signal and filters the signal to produce a signal that has been compensated for inadequacies in the signal acquisition system's front end.

Figure 2:
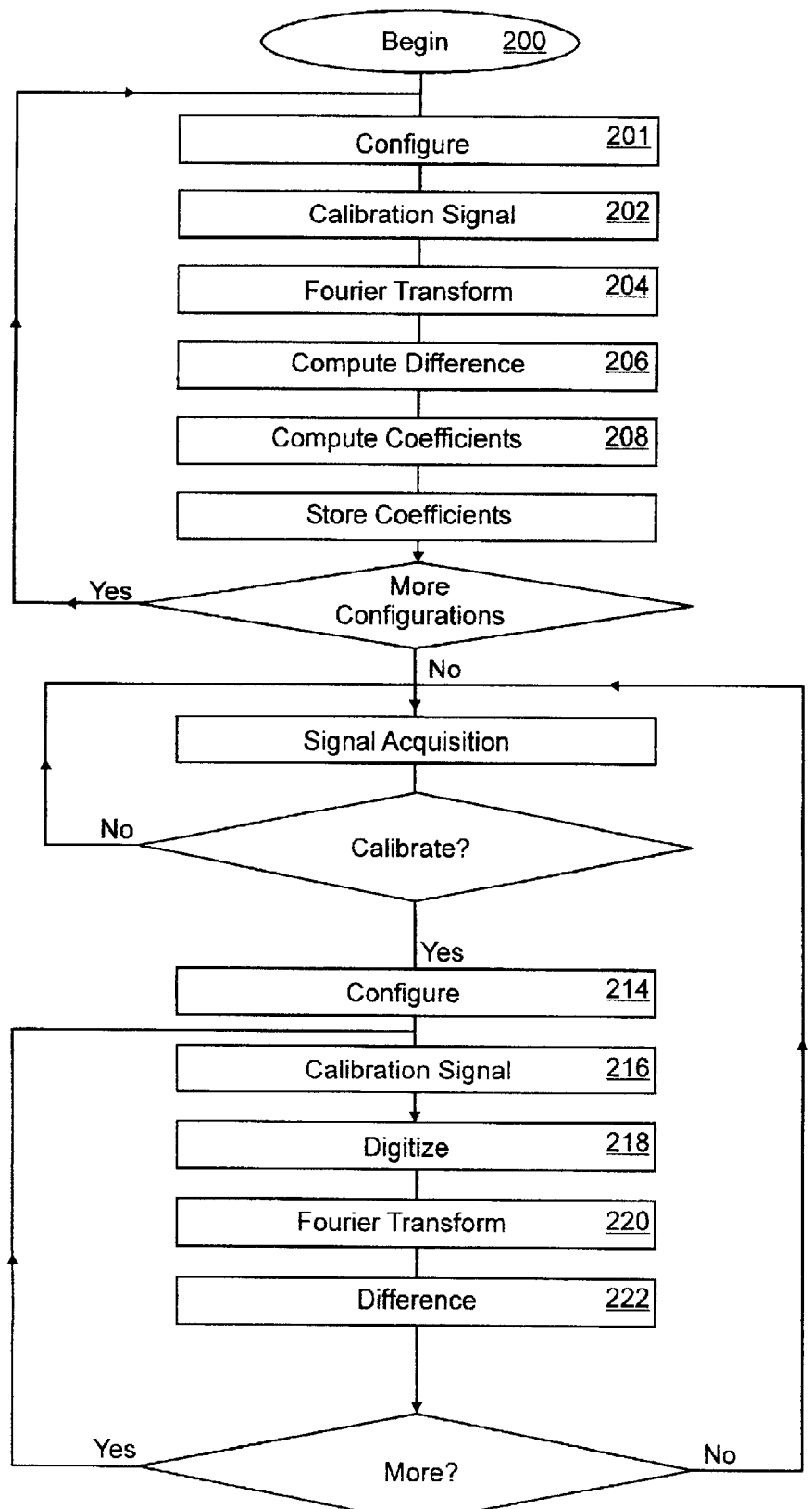
FIG. 2 is a flowchart depicting the operational processes of a signal acquisition system in accordance with the principles of the present invention.

Coefficients for the equalizer 104 are determined and stored within the system during a calibration process described in greater detail in the discussion related to FIG. 2. The calibration process may include the development of coefficients for a variety of signal acquisition system settings or configurations. For example, in a digital oscilloscope embodiment of a signal acquisition system in accordance with the principles of the present invention, the equalizer may accommodate the use of various types of probe by storing different sets of equalization coefficients, with each set corresponding to a different type of probe.

Additionally, the acquisition system may include transfer function storage 120 and a processor 122, such as a digital signal processor (DSP), that may be employed to update the equalizer's coefficients in the field. In such an embodiment, a calibration signal that is the same as the calibration signal initially used to determine the equalizer coefficients may be sent to the signal acquisition system 100. With the equalizer 104 set to a neutral setting the DSP 122 performs the same operations as originally performed during the initial calibration process, using the stored transfer function of the model signal acquisition system as the basis for comparison and the computation of the equalizer's coefficients. The transfer function may be stored in the form of amplitude frequency response and group delay, for example. Since the stored transfer function information is based on a specific calibration signal, the calibration signal employed in this process should be as closely matched as possible to the original calibration signal used to determine the initial equalizer coefficients.

The flow chart of FIG. 2 illustrates the general operation of a signal acquisition system in accordance with the principles of the present invention. The process begins in step 200 then proceeds to step 201 where the system is configured for calibration. The configuration process may involve the selection of a particular probe for operation with the signal acquisition system, for example. From step 201, the process proceeds to step 202, where the calibration process begins by sending a test signal, such as a step or impulse signal, to a model signal acquisition system and to the signal acquisition system being calibrated. The test signal is a signal of sufficiently high frequency to encompass the range of frequencies for which the signal acquisition system is intended to operate. In step 204 the output of the model signal acquisition system is Fourier-transformed, as is the unequalized output of the target signal acquisition system.

In step 206, the difference between the Fourier transforms of the model and target systems is computed, yielding the amplitude frequency response and group delay for the target signal acquisition system relative to the output of the model system. Given the amplitude-frequency response and group delay, conventional methods may be employed to compute the coefficients of a digital filter, an equalizer, that is used to filter the digitized input signal during normal operations. A commercial software package, such as MATLAB, available from Mathworks, Inc, (http\\WWW.Mathworks.com) may be used to compute the coefficients, given the amplitude frequency response and group delay developed in step 206. In step 208 the equalizer coefficients are stored in the signal acquisition system for use during normal signal acquisition operation. Additionally, transfer function information, in the form of amplitude frequency response and group delay, for example, may be stored within the signal acquisition system for use in the field as described below. Digital equalization is known and described, for example, in U.S. Pat. No. 6,263,354 B1, to Gandhi, issued Jul. 17, 2001, U.S. Pat. No. 6,327,302 B1, to Shen, issued Dec. 4, 2001, U.S. Pat. No. 6,327,315 B1, to Piirainen, issued Dec. 4, 2001, U.S. Pat. No. 5,752,769, to Pressey, issued May 12, 2001, and U.S. Pat. No. 5,930,745, to Swift, issued Jul. 27, 1999, all of which are hereby incorporated by reference.

The process proceeds from step 208 to step 210 where it is determined whether additional calibration configurations will be employed. For example, in a digital oscilloscope embodiment, additional probes may be employed or the calibration process may be conducted with and without a probe attached, for example. If it is determined in step 210 that more system configurations will be calibrated, the process returns to step 201 and proceeds from there as previously described. If all the configurations of interest have been calibrated, the process proceeds from step 210 to step 212 where normal signal acquisition operation begins. During normal operation, the system acquires and digitizes signals of interest. The equalizer employs the coefficients developed during the calibration process to equalize the digitized signals. The equalizer may employ default coefficients and update as indicated by active or passive means. That is, a human operator may intervene through an interface device such as a keyboard, mouse, touch screen, etc. to indicate that a specific system configuration is being employed and the signal acquisition system employs the corresponding equalization coefficients for use with that configuration. Alternatively, in a signal acquisition system that employs passive sensing, the system may sense, for example, the type of probe inserted in a signal acquisition interface and retrieve the appropriate equalization coefficients. The system may also display, store, or transmit for further analysis and/or conditioning data files representative of the digitized signal during such a normal operation period.

At some point, due to an extreme environmental change or to the age of the signal acquisition system, for example, a system operator may decide to re-calibrate the system. The system could be returned to the manufacturer for re-calibration according to steps 200 through 210, as just described. Alternatively, the system operator may re-calibrate the system in the field if the original calibration transfer function information (e.g., amplitude frequency response and group delay) is stored within the signal acquisition system and the operator has access to a signal generator capable of generating the same signals upon which the transfer function information is based. The recalibration process begins in step 214 where the system is configured as desired for the recalibration process and the equalizer is returned to a neutral setting used in the calibration process. From step 214 the process proceeds to step 216 where a calibration signal that is as closely matched to the original calibration signal as possible is sent to the signal acquisition system. In step 218, the calibration signal is digitized by the signal acquisition system. In step 220 the on-board processor computes the Fourier transform of the digitized calibration signal. From step 220 the process proceeds to step 222 where the processor computes the difference between the stored transfer function information and the transfer function information of the target system. That is, the processor computes the difference between the amplitude frequency response and group delay of the model system and that obtained in step 216 through 220. This difference between group delays and amplitude frequency responses is used by the processor to compute the updated equalization coefficients for the particular system configuration being updated. Once computed the equalization coefficients are stored for use in normal operation. In step 224 it is determined whether more equalization coefficients are to be updated and, if so, the process returns to step 214 and from there as previously described. If no more coefficients are to be computed, the process returns to normal operation in step 212.

Figure 3:
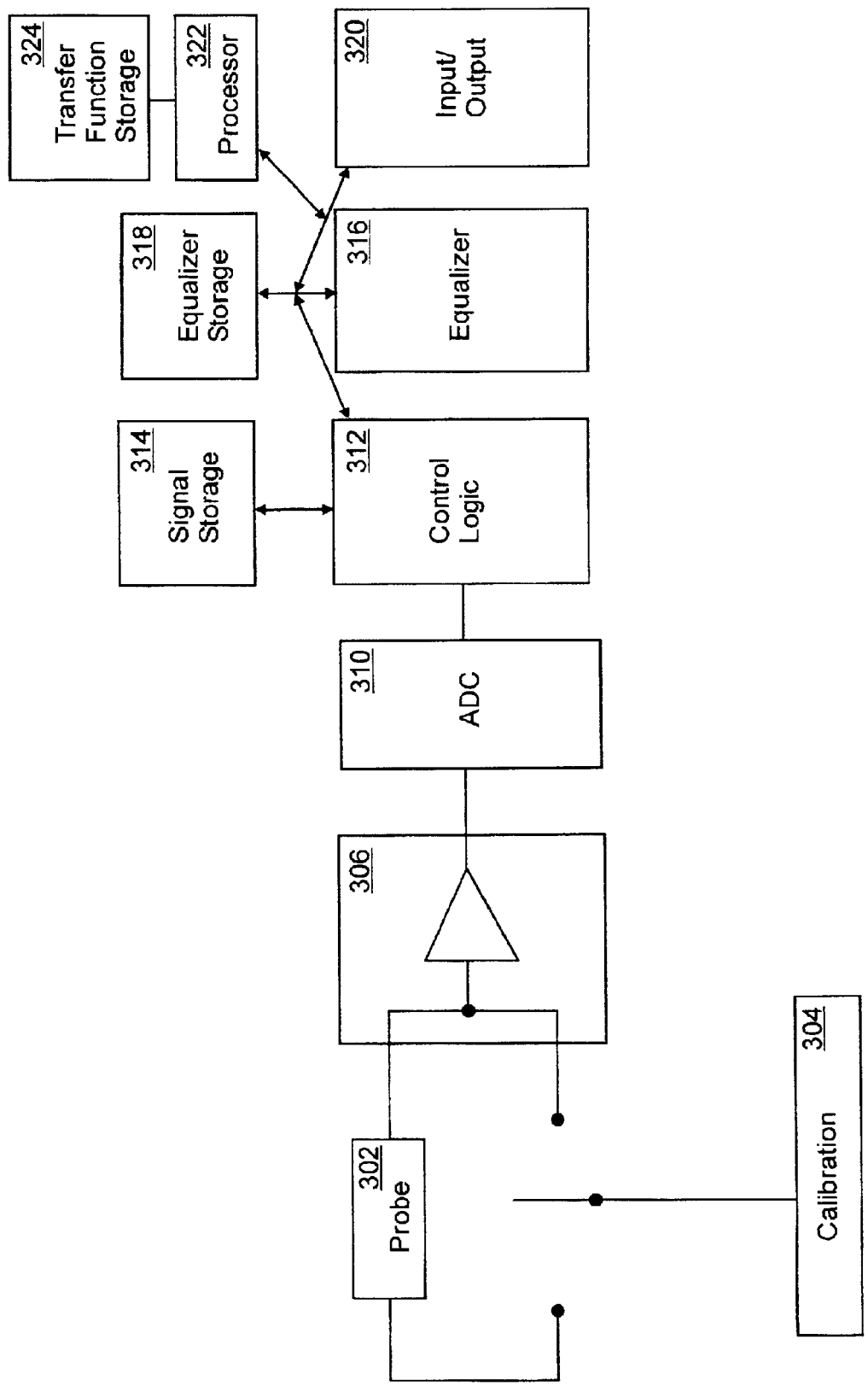
FIG. 3 is a conceptual block diagram of a digital oscilloscope embodiment of a signal acquisition system in accordance with the principles of the present invention.

A digital oscilloscope 300 in accordance with the principles of the present invention is depicted in the conceptual block diagram of FIG. 3. The oscilloscope 300 employs various probes 302 for acquiring signals of interest. The probes may take any of a number of forms, such as a voltage input probe for use in the analysis of digital or analog circuitry, a current input probe for displaying, recording, or analyzing current waveforms through the power transistors of a switching power supply, or a group of contact probes for use in the oscilloscope portion of a medical device, such as an electrocardiographic instrument. The oscilloscope 300 may also include a calibration input 304 directly linked to the front end 306. The calibration input 306 allows direct access to the oscilloscope's front end 308 for a calibration operation. The front end 306 may include various amplifiers and signal conditioning equipment. After amplification and/or processing of the continuous signals received by the front end 306, the signals are sent from the front end 306 to the ADC 310 where they are converted to digital representations of the received continuous signals. After digitization, the signals are processed by control logic 312 to be stored in signal storage 314 for later access and/or sent to the equalizer 316 for equalization.

The oscilloscope 300 equalizes the digitized signal before displaying, storing, transmitting or otherwise "outputting"

the signal. Equalizer coefficients are determined during a calibration process and stored in equalizer storage 318. The oscilloscope 300 employs the coefficients stored within the storage 318 during operation in the field to enhance the response of the oscilloscope by compensating for inadequacies of the front end 306. During a calibration process, when the oscilloscope receives a calibration signal, the equalizer 316 is set to a neutral mode, whereby the received signal is, in effect, simply passed through the equalizer unimpeded. The equalizer coefficients are determined and stored as described in greater detail in the discussion related to FIG. 2. During normal operation, equalized signals are provided to an input/output system 320, which may include a display (not shown) or an output interface (not shown) for transmitting the equalized signal to other devices for further processing. The oscilloscope 300 may include a processor, such as DSP 322, connected to receive equalized signals from the equalizer 316. The processor 322 may be used to perform a variety of signal conditioning operations on the equalized signals and/or may be used to analyze the signals. During a field calibration, the DSP 322 may perform the calculations necessary to determine the equalization coefficients based on model transfer function information stored in transfer function storage 324 and "pass through" signals received from the equalizer 316.

Figure 4:
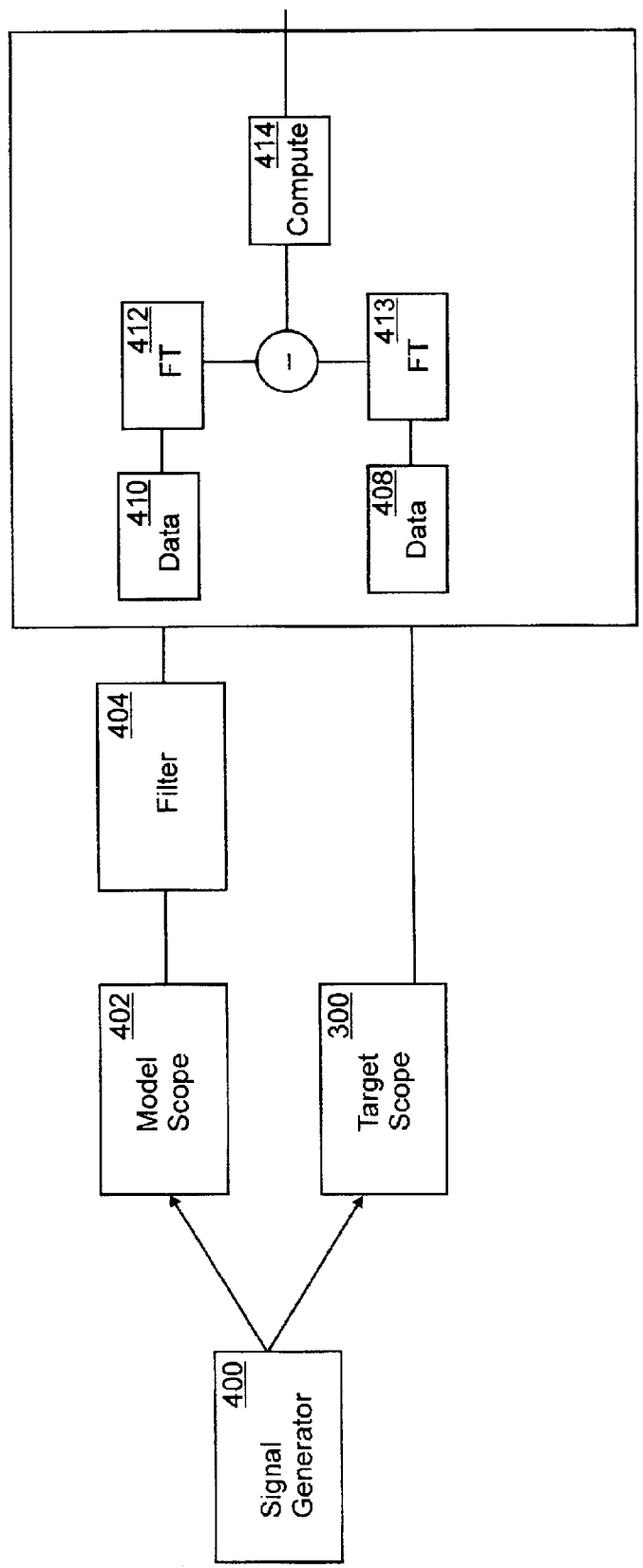
FIG. 4 is a conceptual block diagram of a calibration set up for a digital oscilloscope in accordance with the principles of the present invention.

The block diagram of FIG. 4 illustrates the components of a calibration system for use with a digital oscilloscope 300 that includes an equalizer 316 in accordance with the principles of the present invention. During the calibration process, a test signal generator 400 sends a relatively high bandwidth continuous time signal to both the oscilloscope 300 and a model oscilloscope 402. The model oscilloscope 402 is of much higher bandwidth than the "target" oscilloscope 300. For example, for a 4 Ghz bandwidth target oscilloscope, the model signal acquisition system would include a relatively high bandwidth digital oscilloscope, such as a 50 Ghz oscilloscope, that is configured to receive the calibration signal. The model oscilloscope 402 provides a data stream corresponding to the continuous time calibration signal to a simulation filter 404. The simulation filter 404 exhibits the frequency response desired of the target oscilloscope. A processor 406 Fourier transforms the target oscilloscope 300 data file 408 and the filter 404 data file 410, computes the difference between the Fourier transforms 412,413. That is, the processor 406 computes the difference between the amplitude frequency responses and group delays of the target oscilloscope 300 and the model oscilloscope 402/filter 404 combination. The amplitude frequency response and group delay difference is used by the processor to compute the equalizer coefficients 414, and these coefficients are stored for use by the equalizer 316 within the target oscilloscope 300. As previously noted, such equalization coefficients may be computed and stored for a variety of oscilloscope configurations.

Figure 6A:
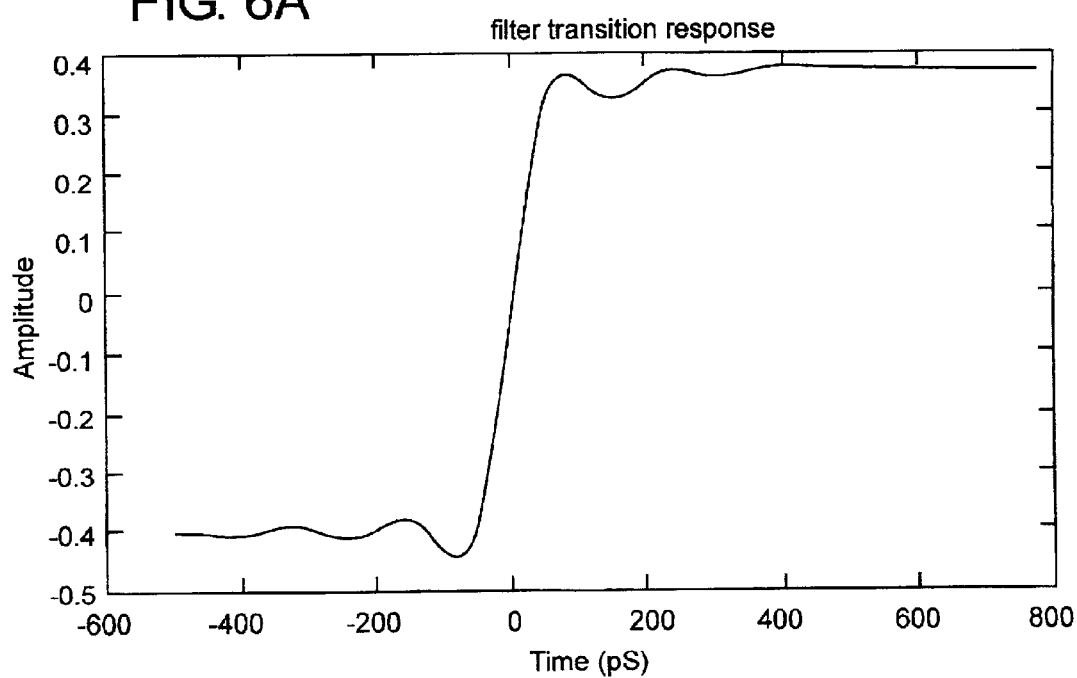
FIGS. 6A and 6B are graphical representations a 4 GHz filter transistion response and signal spectrum employed in the calibration of a a digital 4 GHz oscilloscope in accordance with the principles of the present invention.
Figure 6B:
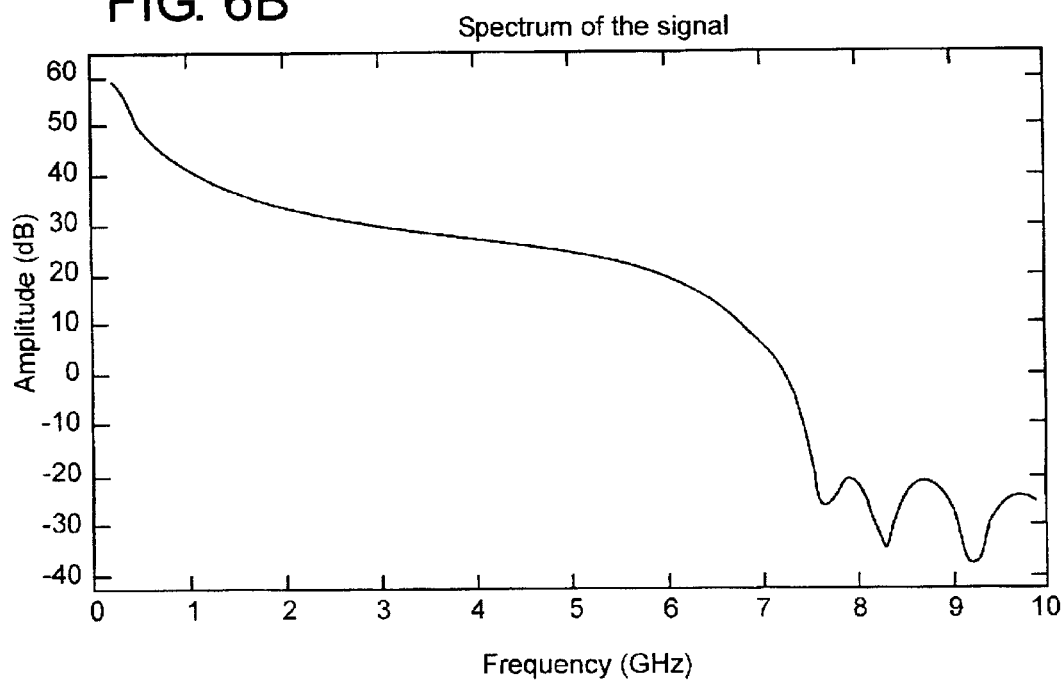

The graphical representations of FIGS. 5A and 5B depict the transition response and signal spectrum of a 50 GHz sampling scope employed in the calibration of a digital 4 GHz oscilloscope in accordance with the principles of the present invention, using a calibration setup as described in the discussion related to FIG. 4, using the process described in the discussion related to FIG. 2. FIGS. 6A and 6B are graphical representations a 4 GHz filter transistion response and signal spectrum employed in the calibration of a digital 4 GHz oscilloscope in accordance with the principles of the present invention as described in greater detail in the discussions related to FIGS. 2 and 4. The graphical representations of FIGS. 7A and 7B depict the transition response and signal spectrum of a digital 4 GHz oscilloscope in accordance with the principles of the present invention, without equalization. This spectrum would be used in the calibration process to determine equalizer coefficients, as described in the discussions related to FIGS. 2 and 4.

Figure 9:
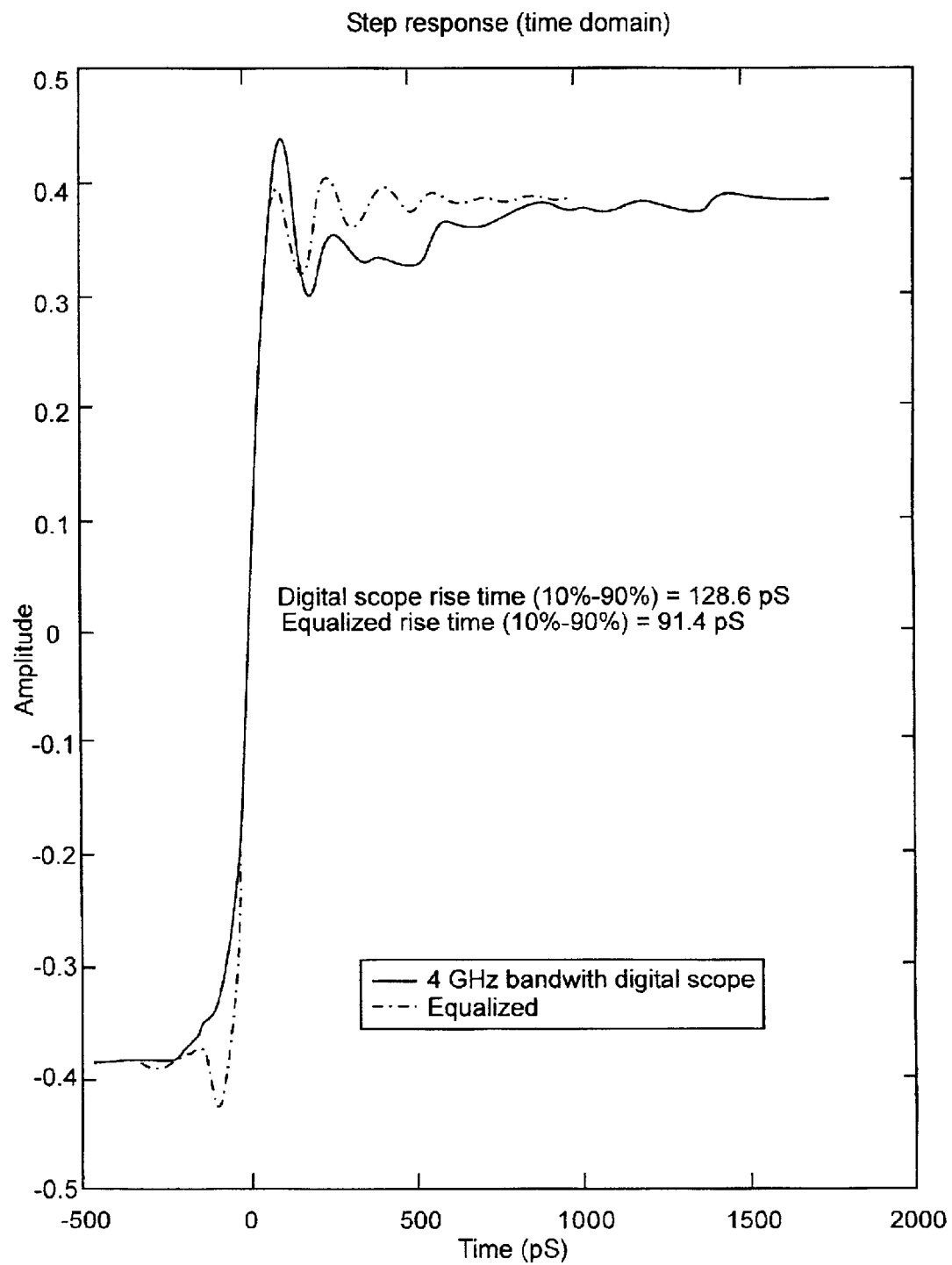
FIG. 9 is a graphical representation of the unequalized and equalized step response of a digital 4 GHz oscilloscope in accordance with the principles of the present invention.
Figure 10:
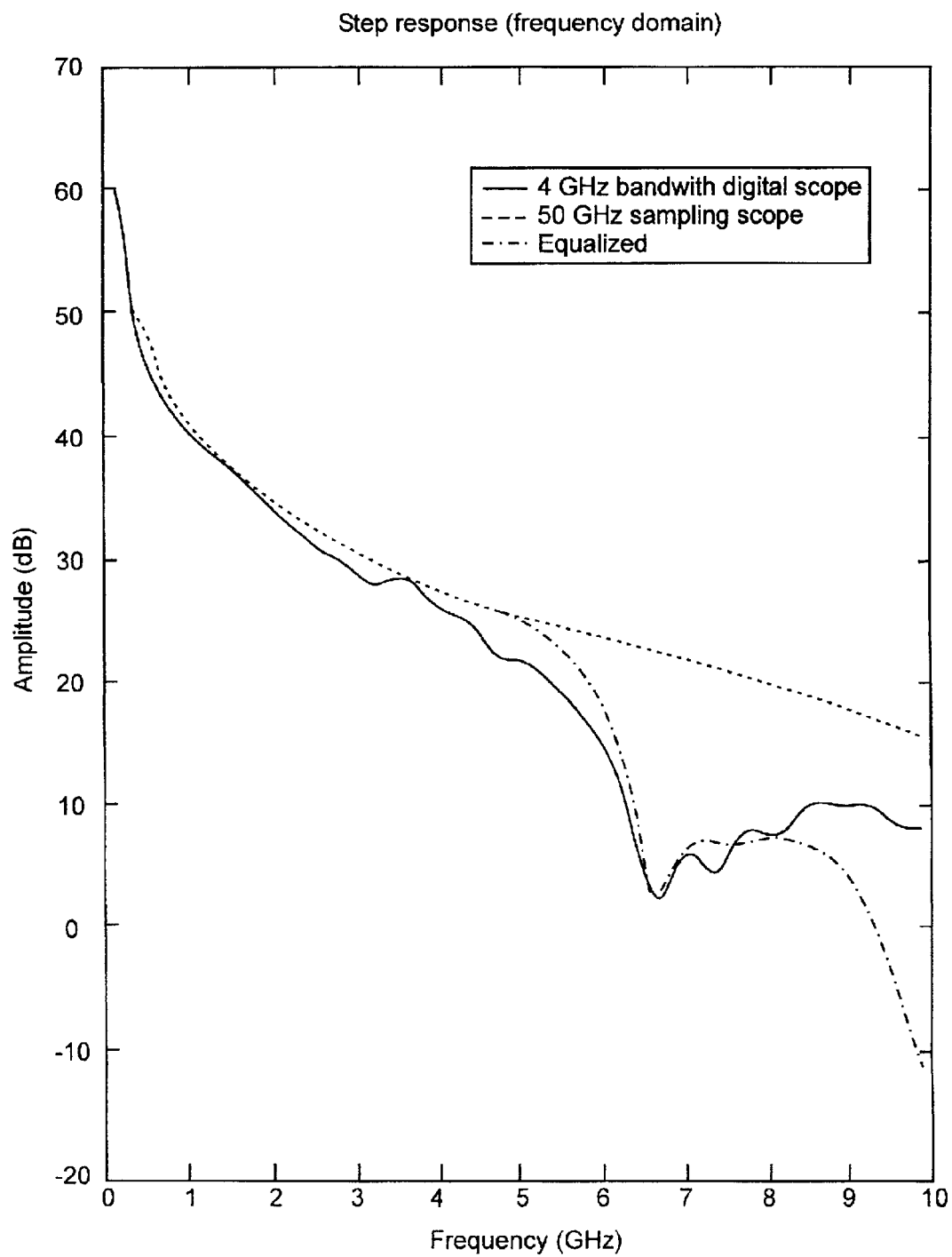
FIG. 10 is a graphical representation of the step response (frequency domain) of the unequalized and equalized 4 GHz oscilloscope in accordance with the principles of the present invention and the step response (frequency domain) of a 50 GHz oscilloscope used in the determination of the equalizer coefficients.

The frequency response and group delay of an equalizer developed according to the discussions related to FIGS. 2 and 4 is depicted in the graphical representations of FIGS. 8A and 8B. The unequalized and equalized step responses of a digital oscilloscope in accordance with the principles of the present invention are depicted in the graphical representations of FIG. 9. The graph of FIG. 10 displays the step response (frequency domain) of the unequalized and equalized 4 GHz oscilloscope in accordance with the principles of the present invention and the step response (frequency domain) of a 50 GHz oscilloscope used in the determination of the equalizer coefficients for the 4 GHz oscilloscope. The the equalized frequency response and group delay of the 4 GHz digital oscilloscope in accordance with the principles of the present invention are shown in the graphs of FIGS. 11A and 11B.

Although various exemplary embodiments of the invention have been disclosed, it will be apparent to those skilled in the art that various changes and modifications can be made which will achieve some of the advantages of the invention without departing from the spirit and scope of the invention. It will be apparent to those reasonably skilled in the art that other components performing the same functions may be suitably substituted. The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A method of signal acquisition comprising the steps of:
    (A) sending a calibration signal to model and target signal acquisition system to determine equalization coefficients;
    (B) storing equalization coefficients in the target signal acquisition system; and
    (C) employing the equalization coefficients stored in step B) to equalize a signal acquired by the target signal acquisition system.

2. The method of claim 1 further comprising the step of:
    (D) repeating steps (A) and (B) for a plurality of target signal acquisition system configurations.

3. The method of claim 2 wherein a variety of input probes are used with the signal acquisition system to alter the configuration of the target signal acquisition system configuration.

4. A method for electronic signal acquisition, comprising the steps of:
    (A) transmitting an analog calibration signal to a model signal acquisition system and to a target signal acquisition system to produce a corresponding digital output signal from the model signal acquisition system and a corresponding digital output signal from the target signal acquisition system;
    (B) Fourier-transforming the digital output signals produced in step (A);

(C) computing the difference between the Fourier transform of the signal from the model signal acquisition system and the Fourier transform of the signal from the target signal acquisition system to yield equalization requirement values;

(D) computing equalization coefficients based upon the equalization requirement values;

(E) storing the equalization coefficients in the target signal acquisition system; and (F) employing the equalization coefficients to equalize a signal acquired by the system target data-acquisition system.

5. The method of claim 4 further comprising the step of:

(G) repeating steps (A) through (E) for a plurality of target signal acquisition system configurations.

6. The method of claim 5 wherein a variety of input probes are used with the signal acquisition system to alter the configuration of the target signal acquisition system.

7. The method of claim 5 further comprising the step of:

(F) storing model system transfer function information derived from step (B) within the signal acquisition sytem.

8. The method of claim 7 wherein the model system transfer function information includes the amplitude frequency response and group delay of the model system.

9. The method of claim 7 further comprising the step of:

(G) employing the information stored within step 7 to recalculate the equalizer coefficients by the method of steps (B) through (E).

10. A method for calibration and operation of a digital oscilloscope, comprising the steps of:

(A) transmitting an analog calibration signal to a model digital oscilloscope and to a target digital oscilloscope to produce a corresponding digital output signal from the model digital oscilloscope and a corresponding digital output signal from the target digital oscilloscope;

(B) Fourier-transforming the digital output signals produced in step (A);

(C) computing the difference between the Fourier transform of the signal from the model digital oscilloscope and the Fourier transform of the signal from the target digital oscilloscope to yield equalization requirement values;

(D) computing equalization coefficients based upon the equalization requirement values;

(E) storing the equalization coefficients in the target digital oscilloscope; and (F) employing the equalization coefficients to equalize a signal acquired by the system target data-acquisition system.

11. The method of claim 10 further comprising the step of:

(G) displaying one or more traces representative of the equalized signal.

12. The method of claim 11 further comprising the step of:

(H) repeating steps (A) through (E) for a plurality of target digital oscilloscope configurations.

13. The method of claim 12 wherein the plurality of digital oscilloscope configurations of step (H) are created by substituting a plurality of probes for one another in the target digital oscilloscope.

14. The method of claim 12 wherein a digital oscilloscope is combined with a filter to produce the model digital oscilloscope, whereby a digitized input signal produced by a digital oscilloscope of higher bandwidth than the target digital oscilloscope is filtered by a filter having a response reflecting the design goals of the target digital oscilloscope.

15. The method of claim 11 wherein the calibration signal of step (A) includes frequency components that span the frequency range of the target digital oscilloscope's design goals.

16. The method of claim 15 wherein the calibration signal of step (A) is a step input signal.

17. The method of claim 15 wherein the calibration signal of step (A) is an impulse signal.

18. The method of claim 11 wherein the computation of the difference in step (C) yields the amplitude frequency response and group delay of the target system relative to the model system and the amplitude frequency response and group delay are used in step (D) to produce the equalization coefficients.

19. The method of claim 18 wherein the digital oscilloscope's equalizer is set to a neutral position during the calibration process.

20. The method of claim 10 further comprising the step of:

(I) storing model system transfer function information derived from step (B) within the signal acquisition sytem.

21. The method of claim 14 wherein the model digital oscilloscope transfer function information includes the amplitude frequency response and group delay of the model system.

22. The method of claim 20 further comprising the step of:

(J) employing the model oscilloscope transfer function information stored within the digital oscilloscope in step (I) to recalculate the equalizer coefficients by the method of steps (B) through (E).

23. A signal acquisition system comprising:

a front end configured to receive an continuous time signal and to produce a corresponding digitized signal; and an equalizer configured to operate in a neutral position during the signal acquisition system's calibration process and to employ coefficients developed during the calibration process to equalize digitized signals received from the front end during normal operations.

24. The signal acquisition system of claim 23 wherein the equalization coefficients are stored within the signal acquisition system.

25. The signal acquisition system of claim 23 wherein the signal acquisition system is configured to accept a calibration signal having a bandwidth at least as great as the nominal operational bandwidth of the signal acquisition system and to produce a corresponding digitized, non-equalized, output signal during a calibration process.

26. The signal acquisition system of claim 25 further configured to store a plurality of coefficient sets, each set corresponding to a different acquisition system configuration.

27. A digital oscilloscope, comprising:

at least one electronic probe configured to couple a signal from an electrical device to the digital oscilloscope;

a front end configured to receive a continuous time signal and to produce a corresponding digitized signal; and an equalizer configured to operate in a neutral position during the digital oscilloscope's calibration process and to employ coefficients developed during the calibration process to equalize digitized signals received from the front end during normal operations.

28. The digital oscilloscope of claim 27 wherein the equalization coefficients are stored within the digital oscilloscope.

29. The digital oscilloscope of claim 28 wherein the digital oscilloscope is configured to accept a calibration signal having a bandwidth at least as great as the nominal operational bandwidth of the digital oscilloscope and to produce a corresponding digitized, non-equalized, output signal during a calibration process.

30. The digital oscilloscope of claim 29 further configured to store a plurality of coefficient sets, each set corresponding to a different digital oscilloscope configuration.

* * * * *